(12) United States Patent
Muthu-Manivannan et al.

(10) Patent No.: US 7,865,321 B2
(45) Date of Patent: Jan. 4, 2011

(54) ARCING EVENT DETECTION

(75) Inventors: Karthick Muthu-Manivannan, College Station, TX (US); Carl L. Benner, Bryan, TX (US); Peng Xu, College Station, TX (US); B. Don Russell, College Station, TX (US)

(73) Assignee: The Texas A&M University System, College Station, TX (US)

( * ) Notice: Subject to any disclaimer, the term of this patent is extended or adjusted under 35 U.S.C. 154(b) by 240 days.

(21) Appl. No.: 11/865,611

(22) Filed: Oct. 1, 2007

(65) Prior Publication Data
US 2009/0088988 A1 Apr. 2, 2009

(51) Int. Cl.
G01R 31/08 (2006.01)
(52) U.S. Cl. ........................................................ 702/65
(58) Field of Classification Search .................... 702/65
See application file for complete search history.

(56) References Cited

U.S. PATENT DOCUMENTS

| | | | |
|---|---|---|---|
| 4,466,071 A | 8/1984 | Russell et al. | |
| 5,434,509 A * | 7/1995 | Blades | 324/536 |
| 5,485,093 A | 1/1996 | Russell et al. | |
| 5,506,789 A | 4/1996 | Russell et al. | |
| 5,512,832 A | 4/1996 | Russell et al. | |
| 5,550,751 A | 8/1996 | Russell et al. | |
| 5,578,931 A | 11/1996 | Russell et al. | |
| 5,600,526 A | 2/1997 | Russell et al. | |
| 5,659,453 A | 8/1997 | Russell et al. | |
| 6,195,241 B1 | 2/2001 | Brooks et al. | |
| 6,577,484 B1 | 6/2003 | MacBeth et al. | |

OTHER PUBLICATIONS

Nagy I. Elkalashy , A novel selectivity technique for high impedance arcing fault detection in compensated MV networks, Apr. 23, 2007, DOI: 0.1002/etep.179.p. 133-152.*
M. B. Duric, Z.M. Radojevic, and V.V. Terzija, Time domain solution of arcing faults detection and fault distance calculation on distribution lines,: in Proc. CIRED 97, Jun. 1997, pp. 1.1.1-1.1.5.

* cited by examiner

Primary Examiner—Tung S Lau
(74) Attorney, Agent, or Firm—Trego, Hines & Ladenheim, PLLC

(57) ABSTRACT

Methods for detecting electrical arcing on an electrical power system are provided, as well as systems and computer program products for carrying out the method. The method includes the steps of: a) obtaining data indicative of the temporal behavior of a signal which is indicative of a first periodic property of the electrical power system; and b) determining whether an arcing event is present on the electrical power system based on the shape observed in the first data.

10 Claims, 10 Drawing Sheets

ARCING EVENT DETECTION

BACKGROUND OF THE INVENTION

The present invention relates generally to an analysis system for use with an electrical utility power system, and more particularly to a system and a method for detecting arcing events on the power system.

Arcing events may be caused by, for example, downed, broken, tangled or dangling power lines, failing hardware on the power system, trees contacting the power lines, and various other fault situations.

Arcing events are more difficult to detect than conventional overcurrent events, which for instance, occur when a transformer or other apparatus fails. Most conventional overcurrent protection devices, such as fuses, reclosers, relays, and the like have time delays that prevent them from detecting a temporary event. Only if an overcurrent event persists does such a device detect the event. Some arcing events may initialize the timing circuits of the overcurrent protection devices but, by the end of the time delay, the impedance of the event limits the event current to a low value. Such overcurrent protection devices cannot distinguish a current from an arcing event from the levels of current ordinarily drawn by customers. Therefore, these devices may not be able to detect arcing events, which may indicate a hazardous condition on the system or the early stages of failure of system apparatus.

Conventional systems for detecting arcing events utilize analysis of a particular parameter of the electrical power system, such as one or more particular frequency components of current or voltage. In such a system, if the current exceeds a particular threshold for a predetermined duration of time or number of occurrences within a predetermined period of time then an arcing-event-detection signal is generated. In another arcing-event-detection system, transients on a transmission line are modeled before, during, and after the fault occurrence using differential equations. Typically, known arcing-event-detection systems utilize one or more frequency components or traveling waves of a property of the electrical power system.

A problem with some conventional arcing-event-detection systems is that they can not detect arcing events that produce difficult-to-measure, low-magnitude currents from arcing events. Low-magnitude currents can be associated with an arcing event when the conductive path to ground has high impedance. Another problem with conventional arcing-event-detection systems is that they can not utilize more than one property of the electrical power system directly to detect arcing events.

BRIEF SUMMARY OF THE INVENTION

These and other shortcomings of the prior art are addressed by the present invention, which provides a method for detecting arcing events based on monitored signals that are indicative of the performance of the electrical power system, and systems and computer program products for carrying out the method.

According to one aspect of the present invention, a method for detecting electrical arcing on an electrical power system includes the steps of: a) obtaining first data indicative of the temporal behavior of a signal which is indicative of a first periodic property of the electrical power system; and b) determining whether an arcing event is present on the electrical power system based on the shape observed in the first data.

According to another aspect of the invention, a system for detecting electrical arcing on an electrical power system includes: a) a data acquisition unit that is electrically connected to an electrical power system, wherein the data acquisition unit is configured to monitor signals indicative of a first periodic property of the electrical power system; b) a computing device operably connected to the data acquisition unit and programmed to: i) obtain first data from the data acquisition unit indicative of the temporal behavior of the first signal; and ii) determine whether an arcing event is present on the electrical power system based on the shape observed in the first data.

According to another aspect of the invention, a computer program product includes one or more computer readable media having stored thereon a plurality of instructions that, when executed by one or more processors of a system, causes the one or more processors to: a) receive first data which is indicative of the temporal behavior a signal which is indicative of a first periodic property of an electrical power system; and c) determine whether an arcing event is present on the electrical power system based on the shape observed in the first data.

BRIEF DESCRIPTION OF THE DRAWINGS

The subject matter that is regarded as the invention may be best understood by reference to the following description taken in conjunction with the accompanying drawing figures in which.

DETAILED DESCRIPTION OF THE INVENTION

Figure 1:
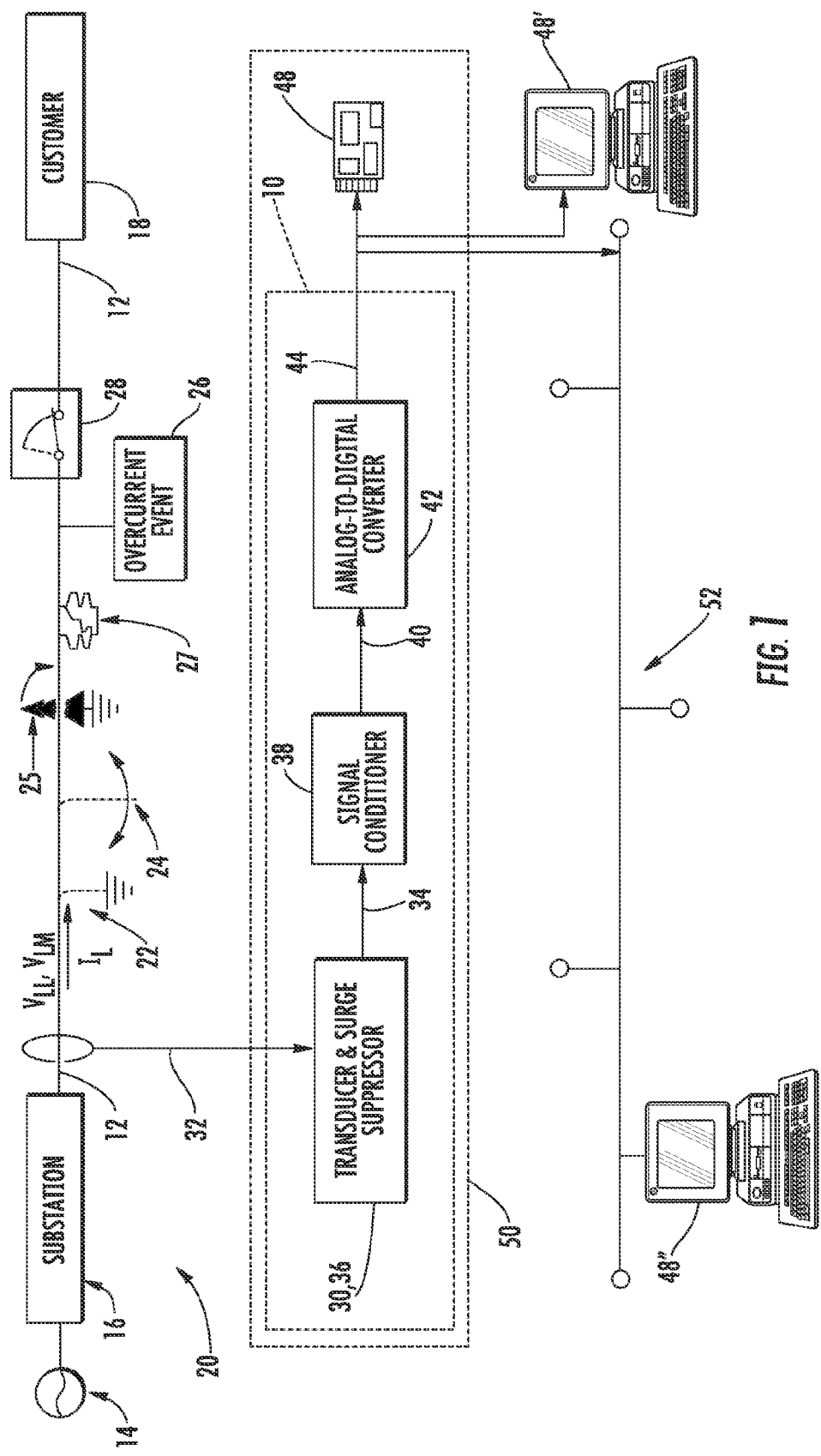
FIG. 1 is a block diagram illustrating the overall design of the invention.

Referring to the drawings, an exemplary arcing-event-detection system constructed according to the present invention is illustrated in FIG. 1, coupled to a feeder line 12 of an electrical power system. The feeder line 12 receives power from an AC power source, such as a generating station 14, through a substation 16. Other feeder lines (not shown) may also receive power from the generating station 14 and exit the substation 16. The feeder line 12 delivers power from the substation 16 to a variety of utility customers, such as customer 18.

Altogether, the generating station 14, the substation 16, and feeder line 12 illustrate a portion of an electrical utility's power system. As used herein, the term "line" refers to one or more conductors grouped together for conducting electrical power from a first point to a second point. As used herein, the term "conductor" refers to a material that provides a path for electricity and includes a metallic wire, a group of wires, or other conductive material.

Although the invention is described as implemented in an electrical power distribution system, it will be understood that it may be implemented in any portion of an electric power system, including but not limited to generating stations, substations, transmission lines, primary and secondary distribution lines, and customer facilities.

Most typical power systems generate and distribute power using a three-phase system. Thus, the feeder line 12 may deliver power over three conductors that each conducts a phase A, B, or C. The feeder line 12 may also have a fourth conductor which is referred to as the neutral. For convenience, power system 20 illustrated herein is such a three-phase system that includes a neutral conductor.

In the illustrated example, the arcing-event-detection system includes a data acquisition unit 10, which is shown at a substation 16 in the illustrated embodiment. It is noted that the arcing-event-detection system and method of the present invention need not include the data acquisition unit 10, but may instead be implemented as software and/or hardware which analyzes data provided from an outside source, such as existing measurement equipment. The present invention may be used at any location within a system of power lines, i.e. generating stations, substations, transmission lines, primary and secondary distribution lines, and customer facilities. Furthermore, multiple data acquisition units 10 can be placed at selected intervals in one or more locations of interest in a power system. For example, data acquisition units 10 could be placed at a substation as well as spread along a line at various distances from a substation such as at 2, 4, 6, and 8 miles from the substation. This "sectionalization" may be useful in determining the specific location of a fault. In this regard, if a fault occurs between miles 4 and 6 from a substation, differences in the signals generated by the data acquisition units 10 positioned at miles 4 and 6 may be useful for determining where the fault occurred relative to miles 4 and 6.

Between the substation 16 and the customer 18, the feeder line 12 may be subjected to a variety of different types of events, conditions, activities, and faults. Some typical events, conditions, activities, and faults are illustrated in FIG. 1, specifically, a downed conductor 22, a dangling conductor 24, contact of vegetation such as a tree 25 or other object with the feeder line 12, and a broken insulator 27. The system may also be subject to other disrupting events, such as an overcurrent event 26 or a switching event performed by a conventional recloser 28 or the like. In addition to conventional faults, the electrical power system is also subject to mis-operation or partial failure of components. For example, devices such as a switching controller for a capacitor bank or a tap changer for a transformer can enter a failure mode in which switching occurs too often. This can cause unacceptable power quality for the customer 18 and wear out the switching equipment, which eventually damages the switching equipment and/or related equipment.

The data acquisition unit 10 includes a monitoring device, such as a sensor or transducer 30, coupled to feeder line 12 as indicated schematically by line 32. The term "monitoring device" is broadly defined herein to include sensing devices, detecting devices, and any other structurally equivalent device or system understood to be interchangeable therewith by those skilled in the art. The illustrated transducer 30 senses or monitors several line parameters, such as line voltages for each phase (line-to-line $V_{LL}$ or line-to-neutral $V_{LN}$), or load current $I_L$ flowing through line 12 for each phase conductor or neutral conductor. Any subset of the 6 voltages or 4 currents measurable in a three-phase system may be monitored. The present invention may also be used with single-phase systems. For instance, in response to monitoring a load current $I_L$ and a line-to-neutral (phase) voltage, transducer 30 produces a parameter signal, here, a signal 34 that is indicative of dual load current and phase voltage. The transducer 30 may be a conventional transducer or an equivalent device, such as a multiple phase current measuring device typically having one current transformer per phase, plus one on the neutral conductor, of the feeder line 12, and a multiple phase voltage measuring device, measuring the line-to-neutral voltages for each phase of line 12. Moreover, the data acquisition unit 10 may receive transducer signals from already existing current and voltage sensors. For example, if only a single phase of the voltage is measured by transducer 30 or another transducer (not shown), the data acquisition unit 10 may be equipped with conventional hardware or software of a known type to derive the other two phases. That is, knowing one phase voltage on a three-phase system, the other two phases may be obtained by applying the appropriate plus/minus appropriate (e.g., 120°) phase shift to the monitored phase voltage. It is also conceivable that other parameters, e.g. power factor, of the power flowing through line 12 may be measured with suitable transducers.

The data acquisition unit 10 may also include surge protection, for example, a surge suppressor or protector 36. The surge protector 36 may be supplied either with the transducer 30, as illustrated, or as a separate component. The surge protector 36 protects the data acquisition unit 10 from power surges on the feeder line 12, such as those caused by lightning strikes or the like.

The data acquisition unit 10 may include a signal conditioner 38 for filtering and amplifying the signal 34 to provide a clean, conditioned signal 40. Preferably, the signal conditioner 38 includes one or more filters (e.g. low-pass, band-pass, high-pass, notch) for removing frequency components not of interest for the analysis such as signal noise. The data acquisition unit 10 may be used with a single frequency in the spectrum, or a combination of frequencies.

The signal conditioner 38 may also amplify the parameter signals 34 for the appropriate range required by an analog-to-digital (A/D) converter 42. For example, the current flowing on the power system 20 may have a dynamic range of 10 to 10,000 Amps, which transducer 30 may convert into a time-varying voltage signal of, for example, ±25 volts, whereas the A/D converter 42 may accept voltages of ±10 volts. In this case the signal conditioner 38 appropriately converts and scales these signals for conversion by the A/D converter 42 from an analog signal 40 into a digital parameter signal 44.

When the transducer 30 is an analog device, the data acquisition unit 10 includes the illustrated discrete A/D converter 42. The transducer 30 may also be implemented as a digital device which incorporates the signal conditioning function of conditioner 38 and the analog-to-digital conversion function of the A/D converter 42.

The digital parameter signal 44 is supplied to a computing device for analysis. An example of a suitable computing device includes a conventional microcomputer (sometimes referred to as a personal computer or "PC"). However, any device capable of executing a program instruction set to analyze the digital parameter signal may be used. As shown in FIG. 1, a computing device 48 such as a "single board computer" is directly connected to the data acquisition unit 10 and may be placed inside a common housing or container with the data acquisition unit 10, or otherwise integrated with the data acquisition unit 10, to form a self-contained detection and analysis unit 50. Alternatively or in addition to the computing unit 48, an external computing unit 48' may be connected to the data acquisition unit 10 using a direct connection such as a serial or parallel cable, wireless link, or the like. Furthermore, the data acquisition unit 10 may be connected to a remote computing unit 48' through a network 52 e.g., a local area network (LAN), a wide area network (WAN), or the Internet. Also, it is noted that the analysis method described herein may be integrated into existing systems which already include data collection and/or processing capability. For example, known types of relays, power quality meters, and other equipment used in power transmission or distribution often contain microprocessor-based electronics suitable for performing the analysis.

Operation

In one embodiment of the present invention, a method is provided to determine whether an arcing event is present on the electrical power system by evaluation of waveforms that are indicative of electrical properties such as voltage and current monitored by data acquisition device 10. The waveforms can be directly indicative of the property or can be derived from one or more properties. As used herein, the term "derived waveforms" refers to waveforms that are generated from waveforms indicative of properties, e.g. current and voltage, of electricity transported on feeder line 12. Derived waveforms can include, but are not limited to, Watts, Volt-Amperes-Reactive (VARs), apparent power, root-mean-square (RMS) signals of voltage, current, and other manipulations and combinations of measured waveforms. Derived waveforms also can include, but are not limited to, the results of filtering or other processes to isolate components of, or otherwise refine the original waveforms, to improve the accuracy and effectiveness of the desired diagnosis results.

By way of example and not limitation, arcing events that can occur in a power system and may be identifiable using the methods of the present invention include the following: arcing with short burst, arcing with long burst, tree-contact arcing, arcing on insulators, arcing on service transformer primary bushing, arcing on service transformer secondary bushing, arcing on service transformer secondary cable, arcing on secondary side of service transformer, arcing on service transformer internal windings, arcing on underground cable splice, arcing on underground cable termination, arcing on underground cable elbow, arcing in lightning arrestor, arcing inside capacitor bank, series arcing in switch/cutout/splice/connector, and combinations thereof. It should be appreciated that if an arcing event cannot be identified as resulting from a particular cause, it can be labeled as generic arcing.

In one embodiment, the shape of the current waveform is used to determine whether an arcing event is present and to identify the source of the arcing event. Features of a waveform that may be indicative of an arcing event are extracted for analysis from the signal monitored by data acquisition device 10. Various signal processing techniques for feature extraction can include, but are not limited to, FFT (fast Fourier transforms), wavelet transforms, and dynamic time warping (DTW).

Optimally, the arcing event current waveform is derived by removing the normal load component, if any, of the current waveform. The resulting waveform is then analyzed for the presence of shapes that are known to be caused by an arcing event on the electrical power system. Many artificial intelligence methods, including but not limited to rule-based systems, fuzzy logic, Bayesian networks, neural networks, hidden Markov model (HMM), and support vector machines, can be used to configure an effective arcing event identifier. It is believed that if the current waveform is similar to that associated with an arcing event that has a particular cause, then the current waveform can be attributed to that cause. The shape of the waveform of an affected phase can be used alone to generally determine whether an arcing event is present. The current waveform may be used without removing the normal load component.

Typically, arcing events having a common cause reoccur in succession, i.e., repeat, but generally very intermittently. In this regard, two arcing events having the same cause may occur in sequential cycles, or a multiple of cycles may separate the arcing events. The "current bursts" caused by arcing events can be analyzed as a group of successive current bursts or they can be analyzed individually.

It is believed that the variation in reoccurrence of arcing events depends on the physical geometry of the cause of the arcing event. For example, the physical geometry associated with an arcing event can cause the arcing event to repeat in a regular pattern. If the physical gap between the affected conductor and an electrical path to ground is small, the arcing event may repeat every cycle such that the shape of the current waveform can be generally sinusoidal. When the current waveform is generally sinusoidal, it may appear to be similar to a waveform generated by the start up of a motor.

In such a case, the current waveform can be identified as being caused by an arcing event by comparing the characteristic shape of a typical arcing event with the additional current associated with the start up of a motor. For example, when a motor is started, an additional start up current having a generally sinusoidal waveform is present above and beyond any normal load current that may be present. The start up current decreases steadily to a final steady-state value as the motor approaches a desired running condition. In contrast, a current waveform caused by an arcing event may be generally sinusoidal without tending to diminish steadily over time. In addition, a generally sinusoidal current waveform will not have the same envelope as a motor start up waveform. Generally, the envelope of a current waveform from an arcing event will be less regular, i.e., rougher, than the envelope of a current waveform from a motor start up.

Alternatively, the shape of the current waveform can be used in conjunction with another waveform to more precisely determine the presence of an arcing event. Current bursts can be attributed to an arcing event by comparing the temporal location of the current bursts of the affected phase with a voltage waveform of that phase. First, waveforms representative of current and voltage of the same phase are obtained. The current waveform is compared with the voltage waveform to determine when the current bursts occurred relative to the voltage peaks. If the current bursts generally coincide with the voltage peaks, then the current bursts are the result of an arcing event. When an arcing event occurs, it often occurs at the point in the cycle when the voltage is near its peak. In other words, a conductor can be spaced apart from a grounding point sufficiently that an arcing event does not occur when the voltage is at a low amplitude. In such a situation, an arcing event occurs at the time in a cycle when the voltage is near a maximum. It can be appreciated that equivalent results could be obtained by comparison in the time domain or by using phase angles obtained from the current and voltage waveforms by known means, e.g., FFTs, at one or more frequencies. It also can be appreciated that arcing between two or more phases can be recognized, in addition to arcing between one phase and neutral or ground. In the case of phase-to-phase voltage, the phase-to-phase voltage associated with the two affected phases is preferably used as the reference against which the peaks in the current waveform are compared.

A voltage waveform can be used with a current waveform to distinguish an arcing event from an acceptable occurrence, such as the motor start up described above. In this case, current bursts associated with a motor start up are not likely to correspond to peaks in voltage. Therefore if current bursts indicated in the analyzed waveform do correspond with voltage peaks, it can be assumed that the current bursts are caused by arcing events. When this analysis is taken together with the shape analysis of the current waveform described above, arcing events can be identified with greater confidence. It can be appreciated that equivalent results could be obtained by comparison in the time domain or by using phase angles obtained from the current and voltage waveforms by known means, e.g., FFTs, at one or more frequencies.

Figure 2:
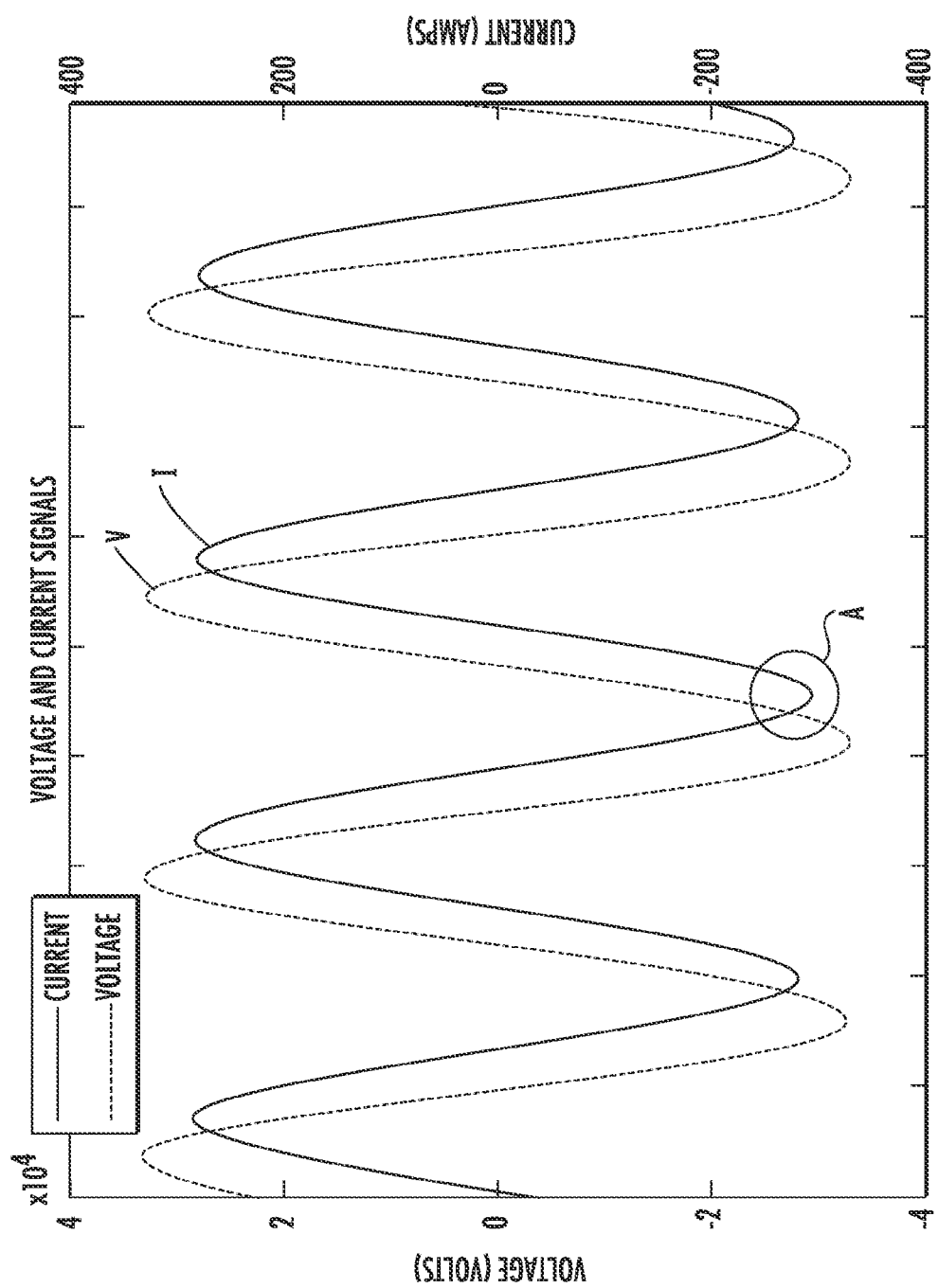
FIG. 2 is a plot of voltage and current waveforms of an arcing event.
Figure 3:
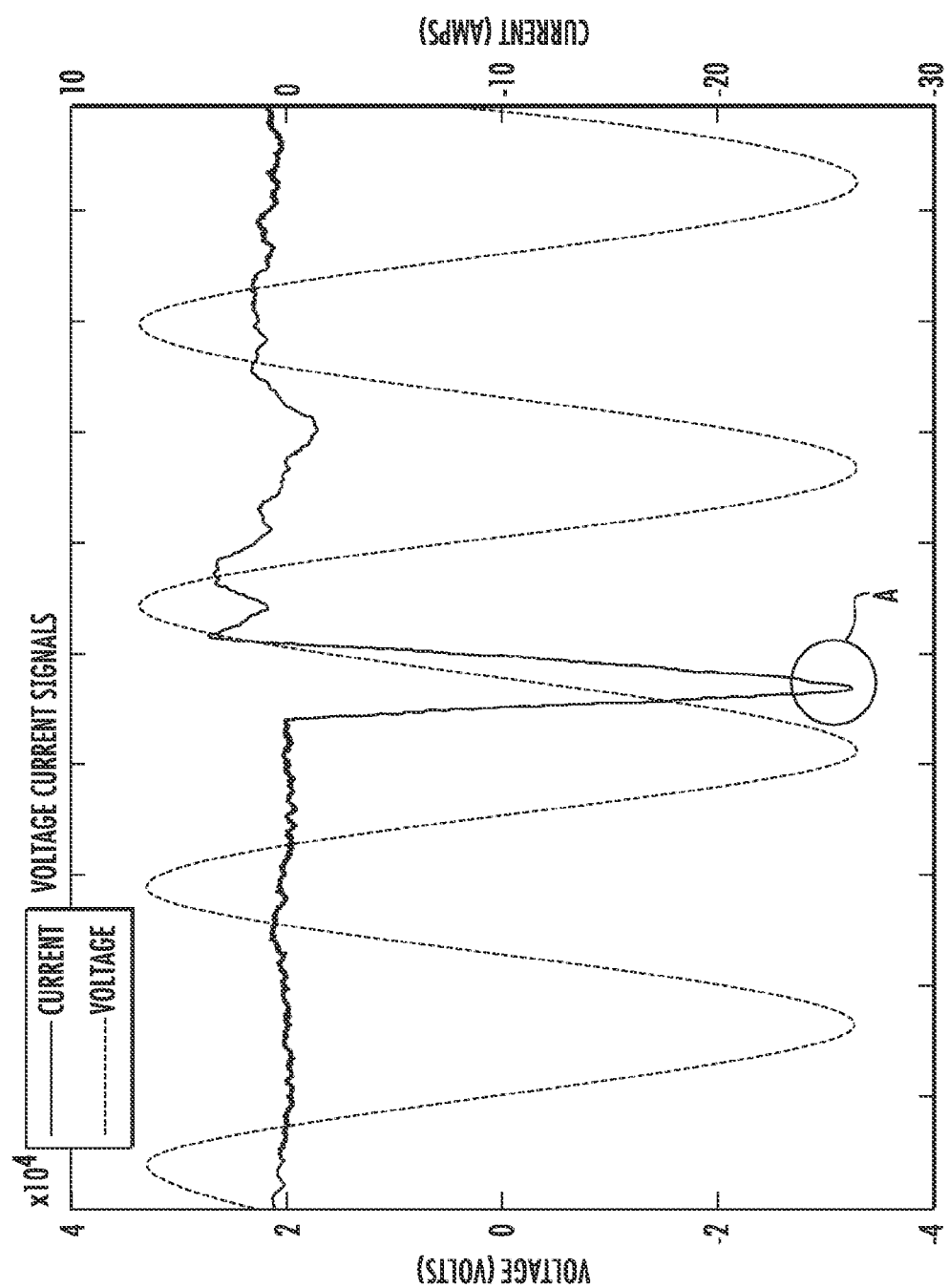
FIG. 3 is a plot of the voltage and current waveforms of an arcing event.

FIG. 2 shows the voltage and current waveforms associated with an exemplary arcing event. Reference letter "A" indicates the cycle in which the arcing event occurs. In this example the current produced by the arcing event is very small in comparison to the load current carried by the line and is shown only by peak A being slightly larger than peaks in other proximate cycles. By optionally removing the steady-state load current waveforms (if present) the current fluctuation caused by the arcing event can be more easily observed and measured. FIG. 3 illustrates the waveforms of FIG. 2 with steady-state current components, i.e., normal load current, removed. Methods for removing the steady-state component are known in the prior art. As shown in FIG. 3, the current waveform at reference letter A caused by the arcing event is more apparent than in FIG. 2.

A current waveform associated with an arcing event has the general shape of the waveform shown in FIG. 3 at reference letter A. Generally, a burst of arcing event current has a peak magnitude of between about 5 and about 50 amperes and is approximately one quarter to one half of one cycle in duration. However, it should be appreciated that larger or smaller amplitudes are possible as are shorter or longer durations.

Figure 4:
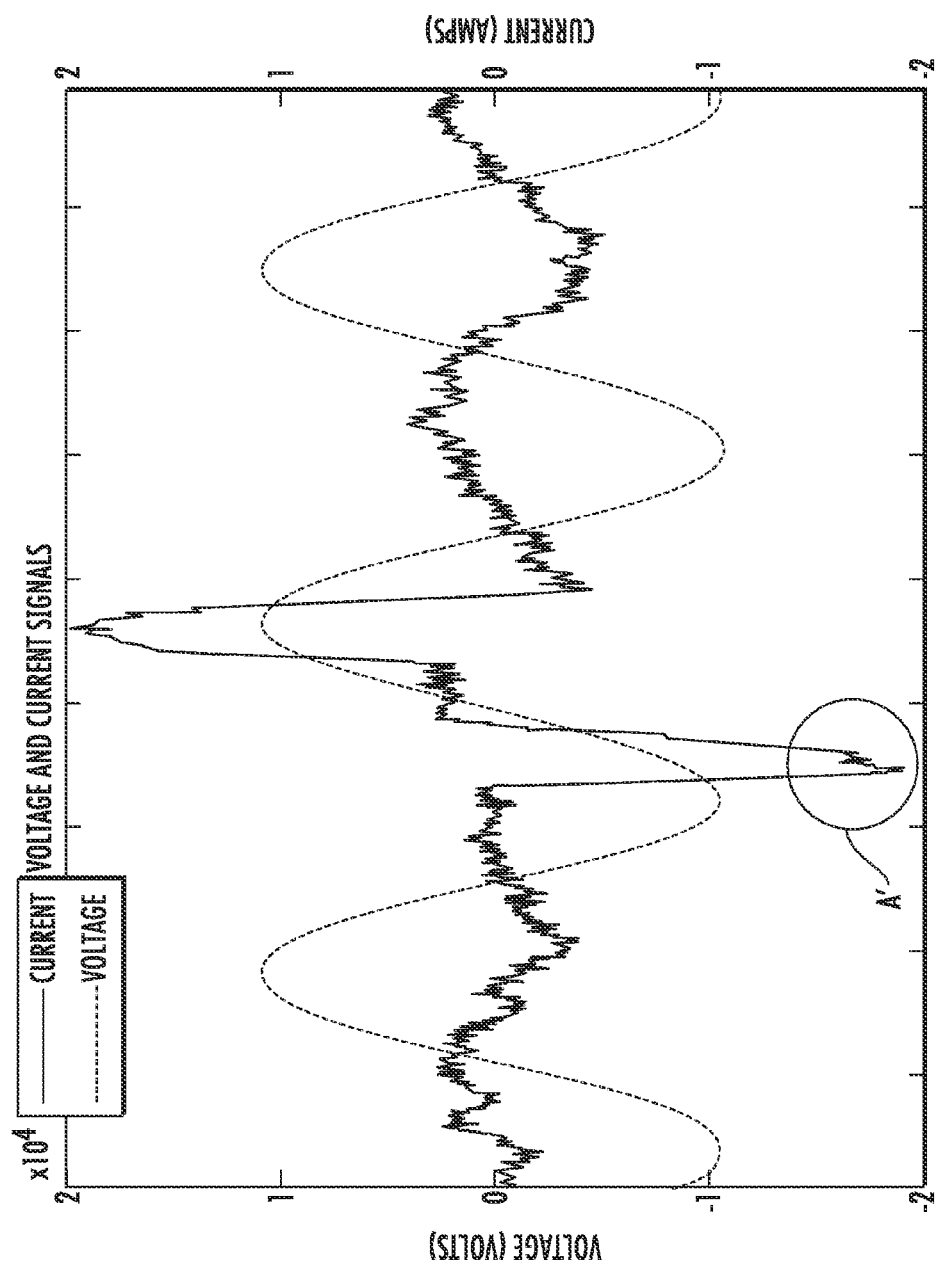
FIG. 4 is a plot of voltage and current waveforms of an arcing event containing a high level of noise.
Figure 5:
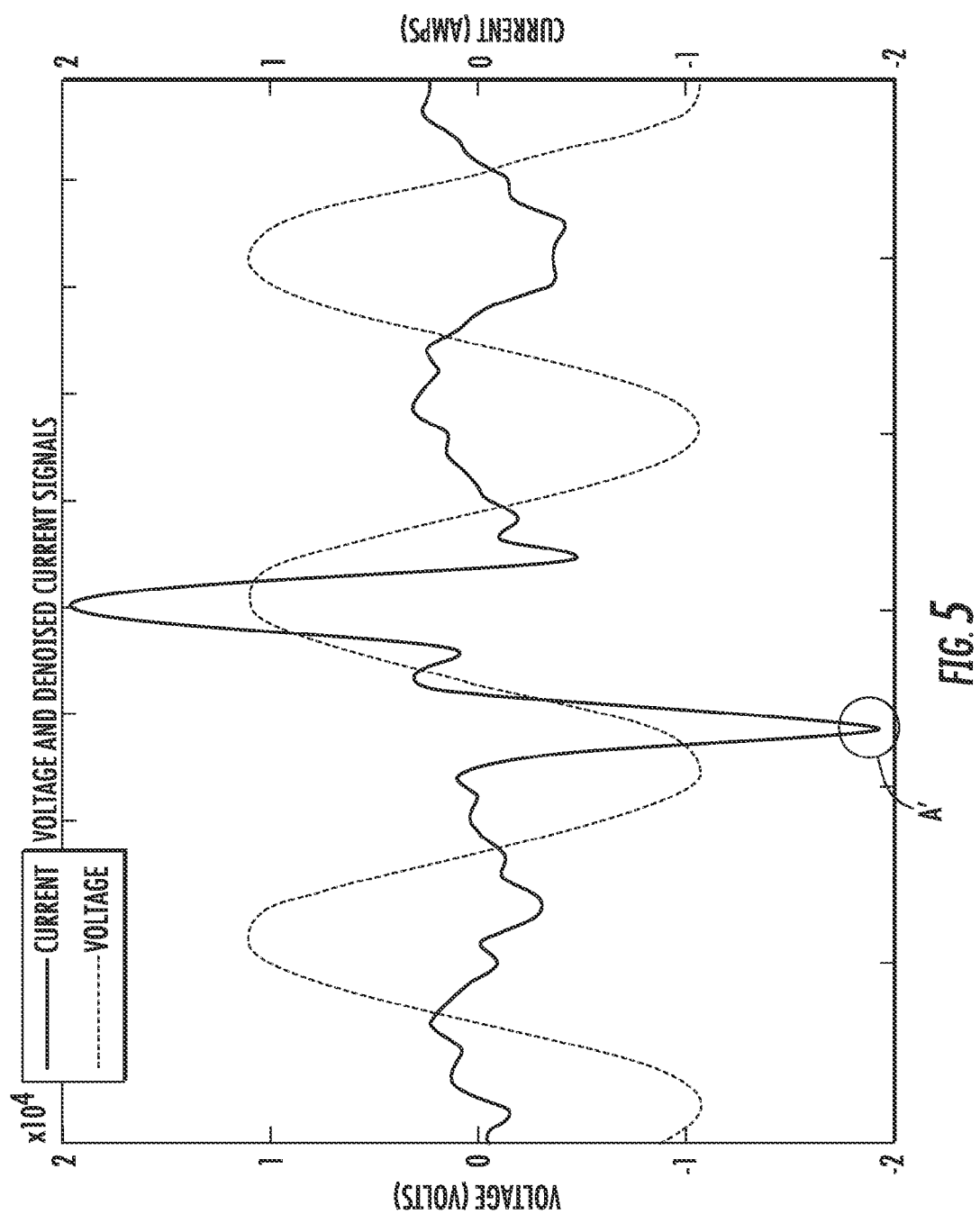
FIG. 5 is a plot of voltage and denoised current waveforms shown in FIG. 4.

To assist in analyzing waveforms, the signal to be analyzed for the presence of an arcing event may be denoised. In this regard, if a current signal contains a high level of noise, some or all of the features indicative of arcing events may become hard to observe as illustrated in FIG. 4. In FIG. 4, the shape of the burst (shown at A') is deformed, and the peaks of the bursts are hard to locate. As a result, it can be difficult to measure the amplitude and duration of the current burst. In FIG. 5, the signal shown in FIG. 4 has been denoised by applying wavelet processing. The processed waveforms in FIG. 5 show all the characteristics of the arcing events and because they are more clearly shown than FIG. 4 the presence of arcing events can be determined more accurately. Although the illustrated example was derived using wavelet techniques, one skilled in the art might apply other techniques including but not limited to, low-pass filtering or curve fitting as alternative means to achieve the same purpose.

Figure 6:
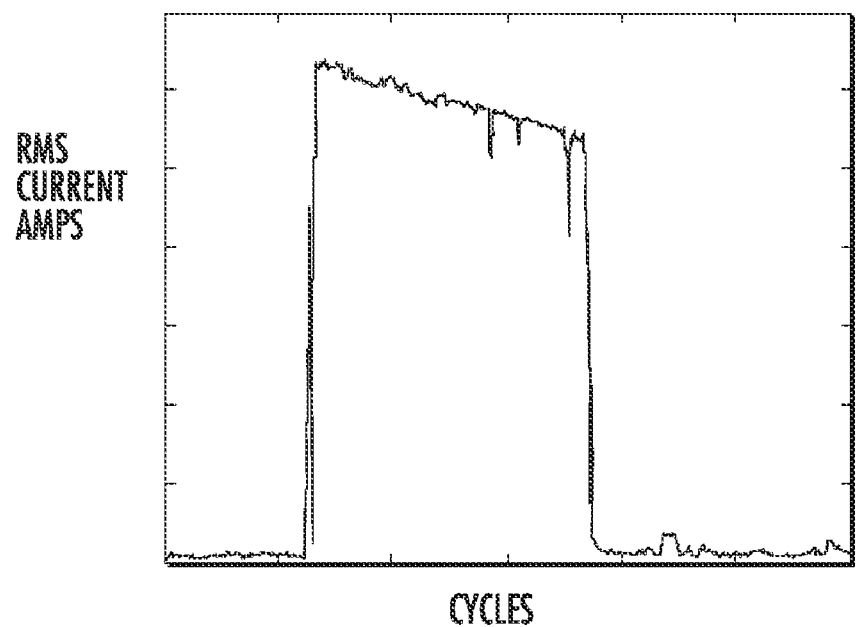
FIG. 6 is an root-mean-square (RMS) current plot of an arcing event.
Figure 7:
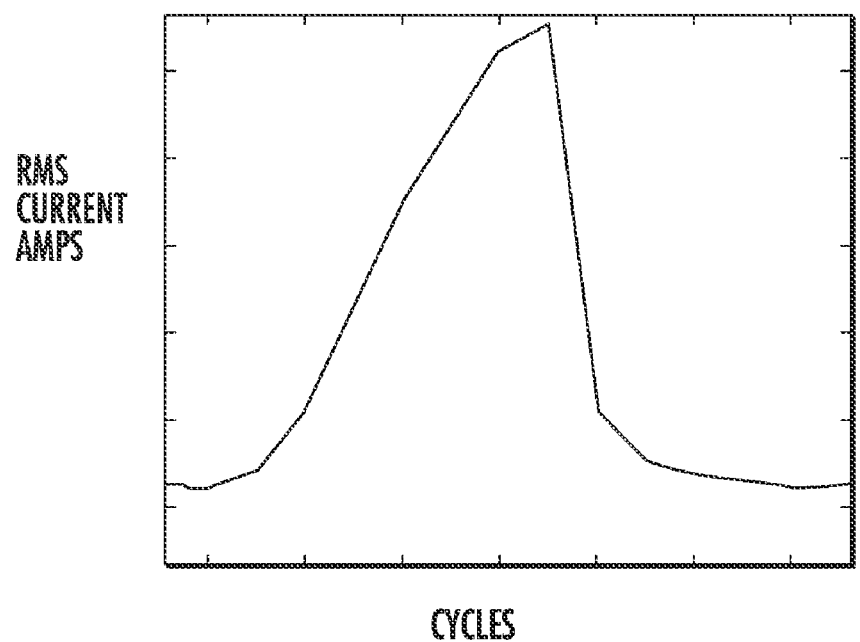
FIG. 7 is an RMS current plot of another arcing event.
Figure 8:
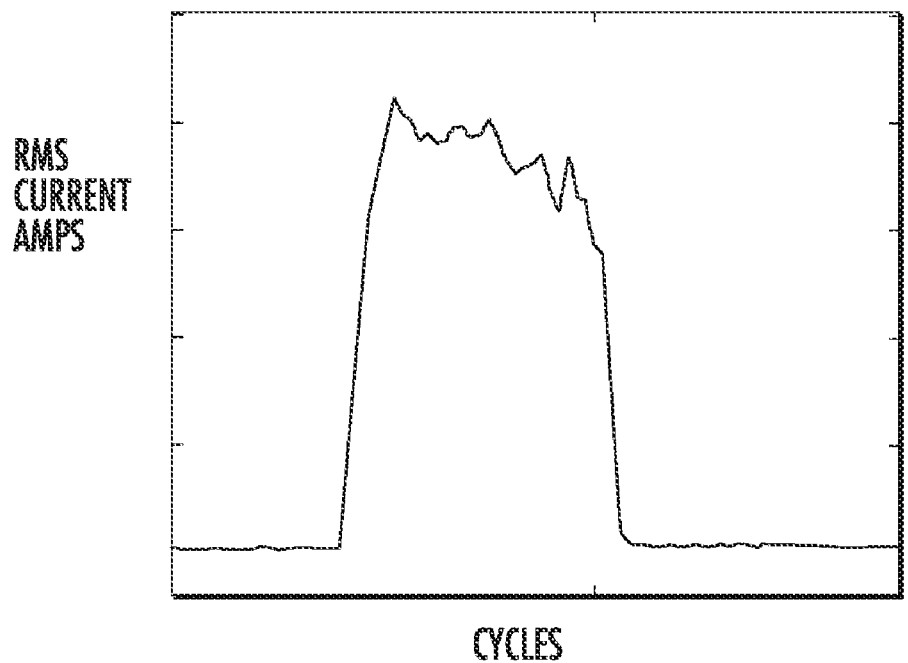
FIG. 8 is an RMS current plot of another arcing event.
Figure 9:
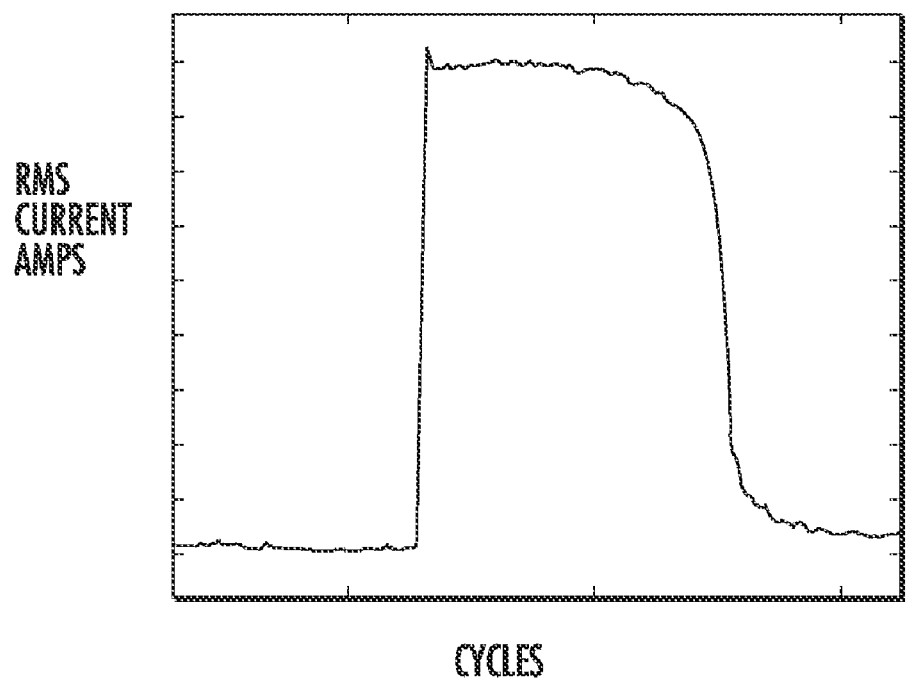
FIG. 9 is an RMS current plot of a motor start up event.

It is noted that the shape analysis can be performed at different resolutions. In particular it may be performed at an RMS-level, examining one value per cycle, or at a sample level, examining multiple values per cycle. While most of the shape analysis described above was using sample level analysis, shape analysis can also be done at an RMS level. Often, a combination of the RMS level and sample level shape analysis is needed to obtain optimal results. FIGS. 6 and 7 are plots of RMS current showing examples of arcing events. In FIG. 6 the arc burst begins with a precipitous increase (i.e. high skew rate or slope) and ends with a precipitous decrease at the end of the arc burst. In FIG. 7 a different arc burst begins with a gradual increase (lower skew rate or slope) and ends with a precipitous decrease. The common feature is the precipitous decrease. Other types of arcing events may not be as readily discernable. For example, FIG. 8 shows an RMS current plot of an arc burst, while FIG. 9 shows a burst caused by motor start up. Each burst begins with a precipitous increase and ends with a gradual decrease. The primary difference observable from the RMS waveforms is that the motor start up of FIG. 9 demonstrates "smoother," less erratic behavior than does the arcing event of FIG. 8.

Figure 10A:
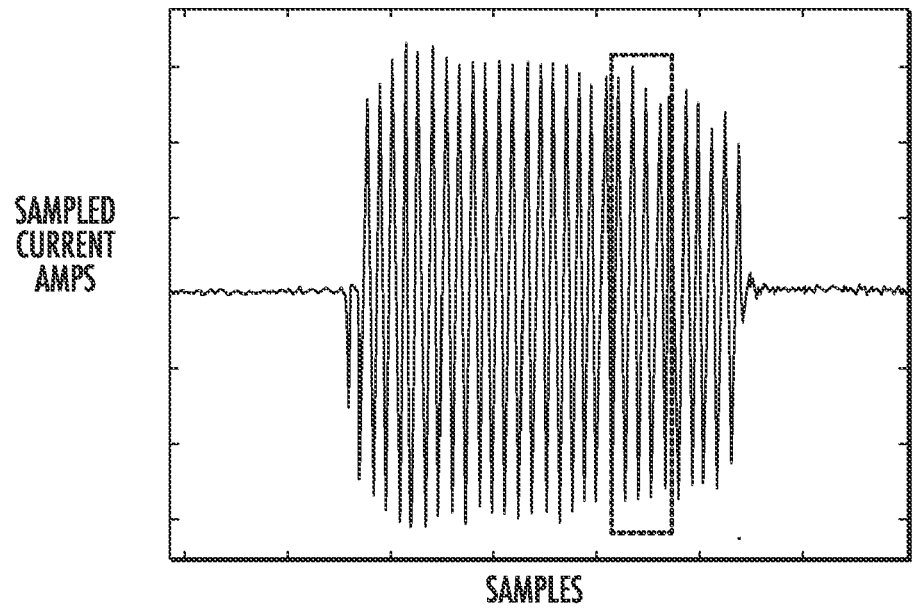
FIG. 10A is a current plot of an arcing event.
Figure 10B:
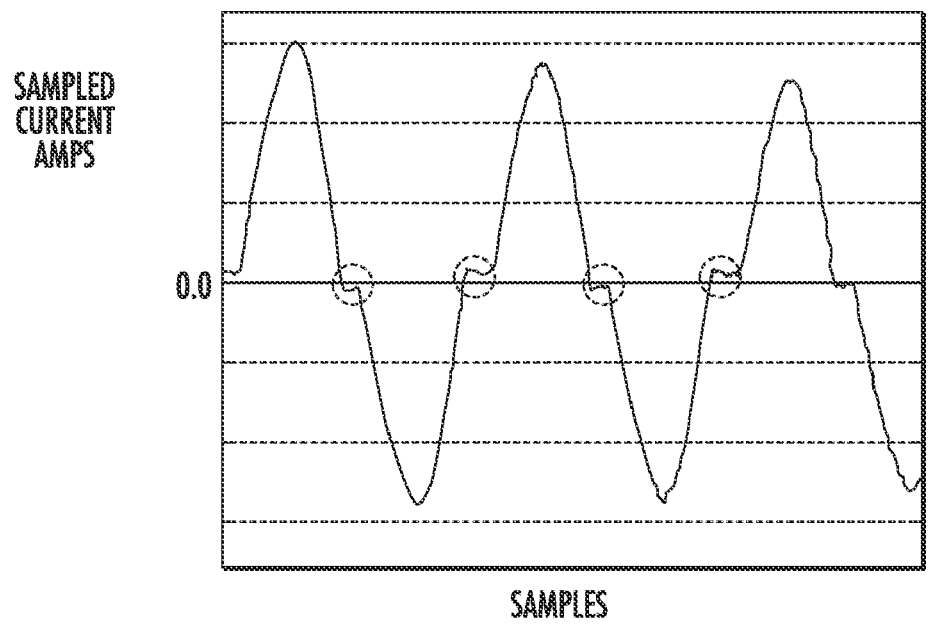
FIG. 10B is an enlarged plot of a portion of FIG. 10A.
Figure 11A:
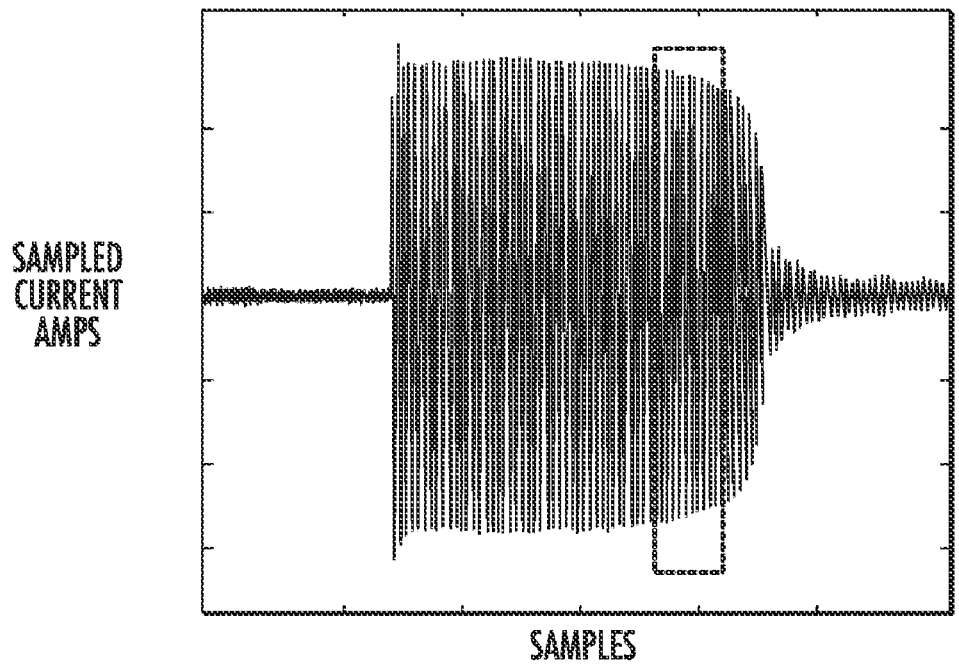
FIG. 11A is a current plot of a motor start up event.
Figure 11B:
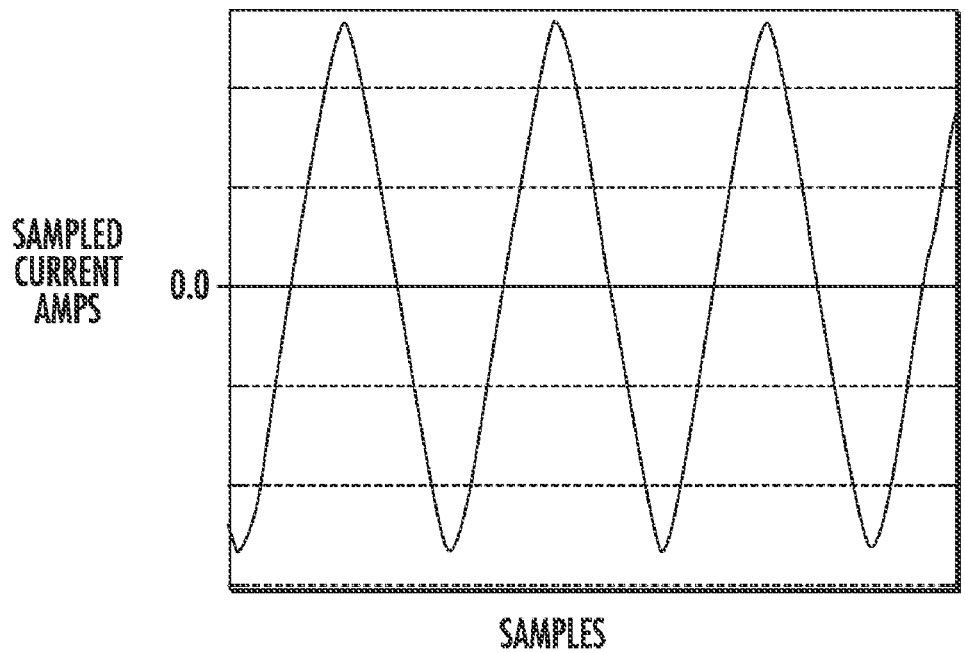
FIG. 11B is an enlarged plot of a portion of FIG. 11A.

In such cases, sample-level shape analysis is helpful to discriminate normal events from arcing events. For example, FIG. 10A shows a current plot of an arcing waveform, while FIG. 11A shows a current plot of a motor start up. At this scale, the events appear similar, as with the RMS-level analysis. However, if the enlarged-scale plots are examined, it can be seen that the motor start up exhibits a continuous waveform (FIG. 11B), while the arcing event (FIG. 10B) shows distinct changes in slope or skew, referred to as generally flat regions or "discontinuities" near where the trace crosses over the zero current line. The presence of these flat regions in a current, voltage, or other waveform is a discriminator for an arcing event versus a normal event.

Regardless of which shape analysis technique is used, a segmentation technique may be used to quickly indicate a short segment of signal wherein an arcing event may be occurring. Segmentation can be accomplished by any one of multiple methods known to those skilled in the art. In this regard, a method is provided for more efficiently detecting arcing events, i.e. detecting arcing events while minimizing use of resources such as computing capacity. Arcing events often only last a very short period of time and detection of arcing events can be very computationally inefficient if each portion of a signal is to be analyzed sequentially.

Figure 12:
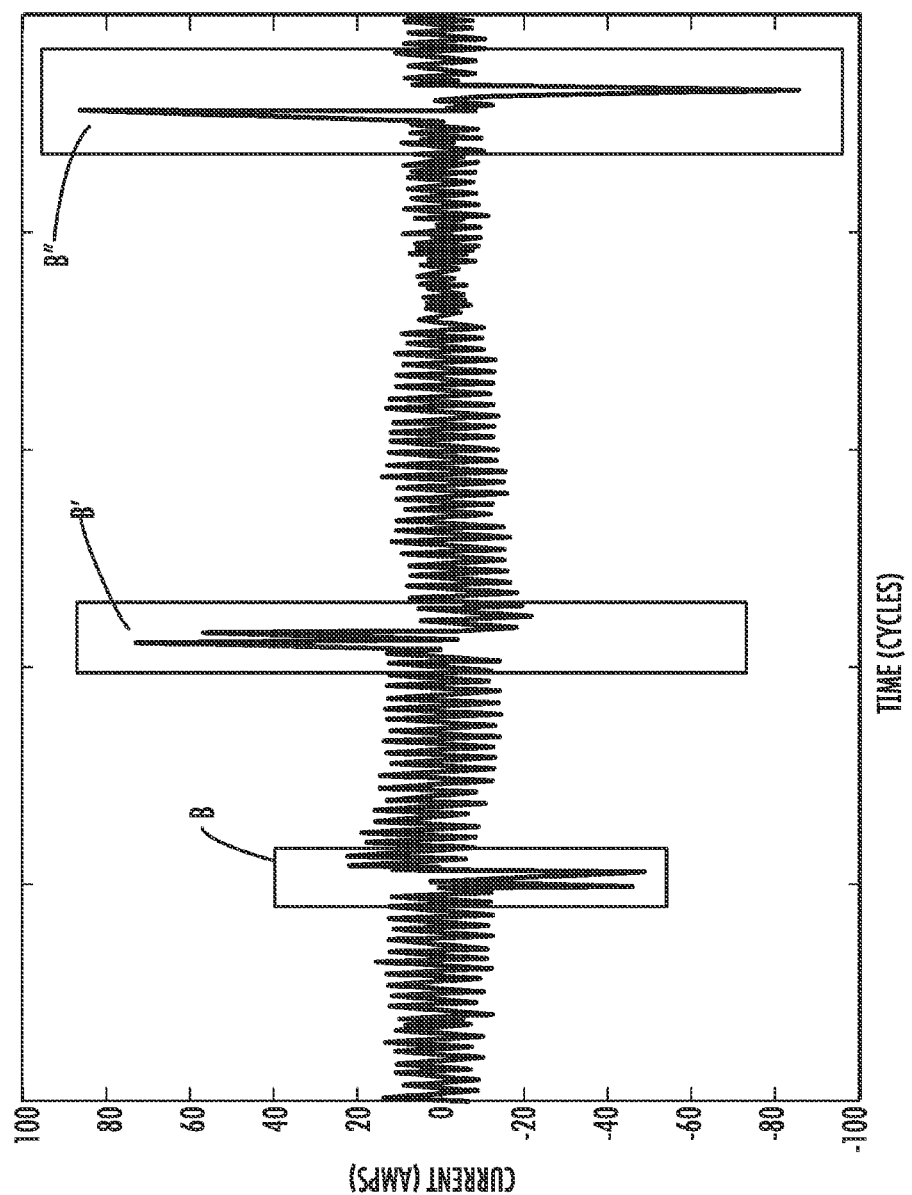
FIG. 12 is a plot of multiple arcing events captured in a short period of time and segments indicating these events.

The segmentation technique may serve as a screening process and preferably should be configured such that generally all potential arcing events are included for analysis. By way of example and not limitation, events that may be screened out can include capacitor energizing, motor starts, inrush currents, conventional overcurrent faults, etc. However, further analysis may determine that some events that are included for analysis may not be associated with arcing events. In one segmentation technique, the amplitude of a current signal from which the load component optionally has been removed is evaluated. If the maximum amplitude in the segment is larger than a threshold, that segment will be selected for more detailed analysis performed by other components. The threshold can be predefined, or be estimated by analyzing multiple segments of the current. FIG. 12 shows an example that has multiple current bursts at reference letters B, B', and B".

It is believed that analysis according to embodiments of the present invention provides about a 90% or higher accuracy rate in identifying whether an arcing event is present on an electrical power system.

As described above, the present invention provides a method for analyzing a signal associated with an arcing event according to the signal's shape. More specifically, embodiments of the present invention provide methods for determining whether an arcing event condition exists on feeder line 12 and further embodiments provide methods for determining the cause of the arcing event based on signal shape. The waveform can be further used to determine the cause of the arcing event. Conventional methods of detecting arcing events utilize the frequency component of a signal, not the shape of the signal. Conventional methods also do not determine or differentiate the underlying cause of an arcing event.

Conventional methods also do not provide analysis or comparison of waveforms indicative of two different properties, e.g., current and voltage, to determine the presence of an arcing event. The present invention allows analysis of phase-to-phase arcing such as would occur as a result of arcing between conductors. Conventional methods of identifying arcing events do not allow this type of comparison.

The foregoing has described a method for identifying the presence of an arcing event on an electrical power system. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

What is claimed is:

1. A method for detecting electrical arcing on an electrical power system, comprising the steps of:
   a) obtaining first data indicative of the temporal behavior of a signal which is indicative of a first periodic property of the electrical power system, the first periodic property being current, wherein the signal includes a steady-state load component as well at least one burst having a magnitude substantially greater than any steady-state load present in the electrical power system, and providing the first data to an electronic computing device;
   b) using the electronic computing device, removing the steady-state load component from the first data; and
   c) using the electronic computing device, observing the first data and determining that an arcing event is present on the electrical power system when the at least one burst within the first data presents a generally sinusoidal shape which includes generally flat regions which are present where the generally sinusoidal shape crosses over a zero-magnitude line.

2. The method of claim 1, further comprising the step of determining the cause of the arcing event by comparing the data to shapes associated with known arcing event types, using the electronic computing device.

3. The method of claim 1, wherein the first data represents a derived characteristic.

4. The method of claim 1, further comprising the step of obtaining second data indicative of a second periodic property and providing the second data to the electronic computing device.

5. The method of claim 1, wherein the first data is indicative of RMS current in the electrical power system.

6. The method of claim 1, further comprising the step of using the electronic computing device to determine that an arcing event is present on the electrical power system when the first data indicates a peak having a precipitous decrease at its end.

7. The method of claim 1 wherein the step of determining whether an arcing event is present includes:
   (a) observing the shape of the first data at a first resolution to determine if an arcing event is potentially present; and
   (b) if an arcing event is determined to be potentially present in step (a), examining the first data at a second resolution finer than the first resolution to determine whether an arcing event is present.

8. The method of claim 4, wherein the second periodic property is voltage.

9. The method of claim 8, wherein the shape of the first data is indicative of current bursts and a shape contained in the second data is indicative of a periodic voltage having voltage peaks.

10. The method of claim 9, further comprising the step of using the electronic computing device to determine that an arcing event is present on the electrical power system when the current bursts indicated by the first data substantially coincide in time with voltage peaks indicated by the shape of the second data.

* * * * *